US005844349A

United States Patent [19]
Oakley et al.

[11] Patent Number: 5,844,349
[45] Date of Patent: Dec. 1, 1998

[54] COMPOSITE AUTOCLAVABLE ULTRASONIC TRANSDUCERS AND METHODS OF MAKING

[75] Inventors: Clyde G. Oakley, Englewood; Stephen J. Douglas, Parker, both of Colo.

[73] Assignee: Tetrad Corporation, Englewood, Colo.

[21] Appl. No.: 798,561

[22] Filed: Feb. 11, 1997

[51] Int. Cl.$^6$ .................................................. H01L 41/08
[52] U.S. Cl. ........................ 310/358; 310/364; 310/368; 310/342; 310/340
[58] Field of Search .................................. 310/358, 364, 310/340, 348, 366, 368, 342

[56] References Cited

U.S. PATENT DOCUMENTS

| | | | |
|---|---|---|---|
| 4,353,958 | 10/1982 | Kita et al. ................................. | 428/329 |
| 4,514,247 | 4/1985 | Zola ........................................ | 156/250 |
| 4,518,889 | 5/1985 | 'T Hoen .................................. | 310/357 |
| 4,564,980 | 1/1986 | Diepers .................................. | 29/25.35 |
| 4,572,981 | 2/1986 | Zola ........................................ | 310/357 |
| 4,717,851 | 1/1988 | Fenner et al. .......................... | 310/334 |
| 4,747,192 | 5/1988 | Rokurota ................................ | 29/25.35 |
| 4,939,826 | 7/1990 | Shoup .................................... | 29/25.35 |
| 4,958,327 | 9/1990 | Saitoh et al. ................................. | 367/7 |
| 4,977,655 | 12/1990 | Martinelli .............................. | 29/25.35 |
| 5,153,859 | 10/1992 | Chatigny et al. ....................... | 367/140 |
| 5,263,004 | 11/1993 | Larson, III ................................. | 367/7 |
| 5,311,095 | 5/1994 | Smith et al. ............................ | 310/334 |
| 5,329,496 | 7/1994 | Smith ..................................... | 367/140 |
| 5,359,760 | 11/1994 | Busse et al. ........................... | 29/25.35 |
| 5,503,152 | 4/1996 | Oakley et al. ...................... | 128/661.01 |
| 5,548,564 | 8/1996 | Smith ..................................... | 367/140 |
| 5,620,479 | 4/1997 | Diederich ................................ | 607/97 |
| 5,625,149 | 4/1997 | Gururaja et al. ......................... | 73/632 |
| 5,650,685 | 7/1997 | Kosinski et al. ....................... | 310/316 |
| 5,684,884 | 11/1997 | Nakaya et al. .......................... | 381/190 |

OTHER PUBLICATIONS

'Active Underwater Acoustic Attenuation Coatings', Dr. Thomas Howarth, Thesis, The Pennsylvania State University, Aug. 1991, pp. 97–137.

'A Precision Tape Casting Machine for Fabricating Thin Ceramic Tapes'.

Runk et al, Ceramic Bulletin, vol. 54, No. 2, (1975), pp. 199–200 'Tape Casting: the Basic Process for Meeting the Needs of the Electronics Industry', R. Mistler, Ceramic Bulletin vol. 69, No. 6, (1990) pp. 1022–1026.

'Tape Casting' R. Mistler, ASM International, Engineered Materials Handbook, vol. 4, (1992), pp. 161–165.

'Processing Parameters and Electric Properties of Doctor–Bladed Ferro–electric Ceramics', C. Wentworth et al, Ceramic Bulletin, vol. 46, No. 12, (1967), pp. 1186–1193.

*Primary Examiner*—Mark O. Budd
*Assistant Examiner*—Timothy A. Williams
*Attorney, Agent, or Firm*—Michael de Angeli

[57] ABSTRACT

An improved composite ultrasonic transducer, and elements therefor, which may be made autoclavable, and a method of making these elements. A number of planar precursors comprising strips of piezoelectric ceramic material separated from one another by a polymer material are stacked one above another with the ceramic strips aligned with one another, and with electrical conductors disposed between each of the planar precursors. These precursors are then bonded to one another, to form a bonded assembly. The bonded assembly is then slit along parallel lines perpendicular to the direction of elongation of the ceramic strips, subdividing the strips into individual ceramic members and also subdividing the planar conductors, forming ribbon-like conductors extending between opposite sides of the array. The saw kerfs are filled with a hardening polymer material. The ribbon-like conductors reaching the edges of the assembly are then connected electrically in parallel, reducing the capacitance of the individual emitters. Criteria for selection of the materials of the ceramic members, the conductors, and other components of the transducer, and their relative proportions are given which allow the transducer to be steam-autoclavable.

18 Claims, 5 Drawing Sheets

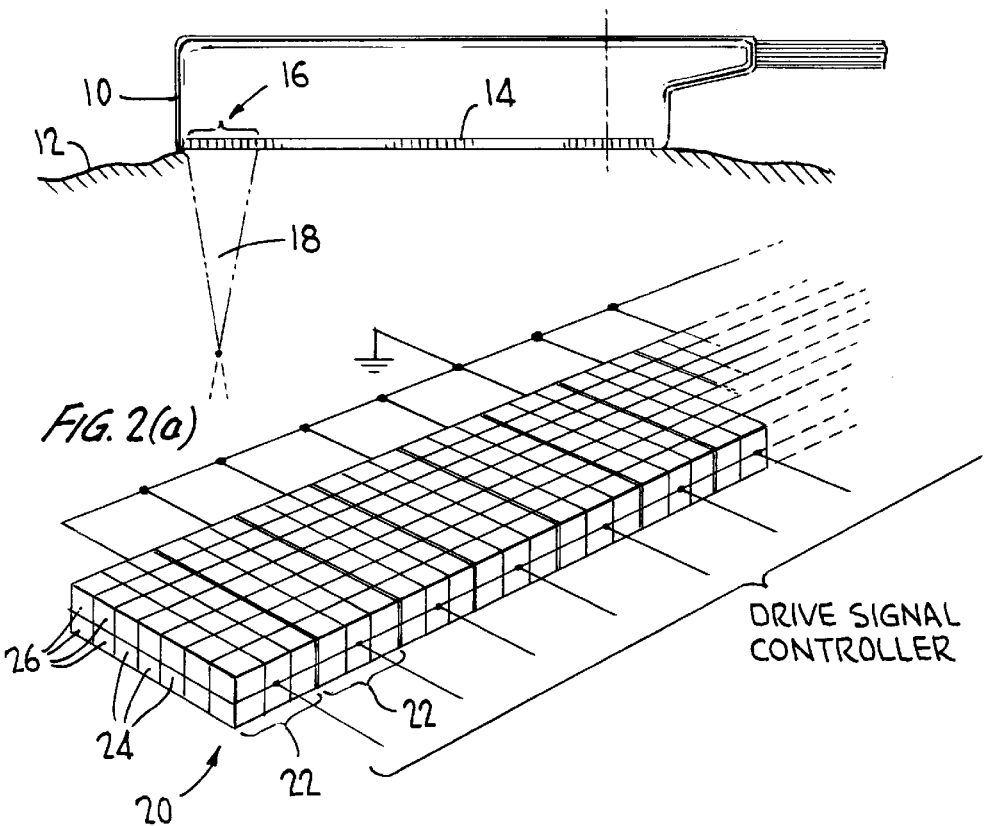
FIG. 1
FIG. 2(a)
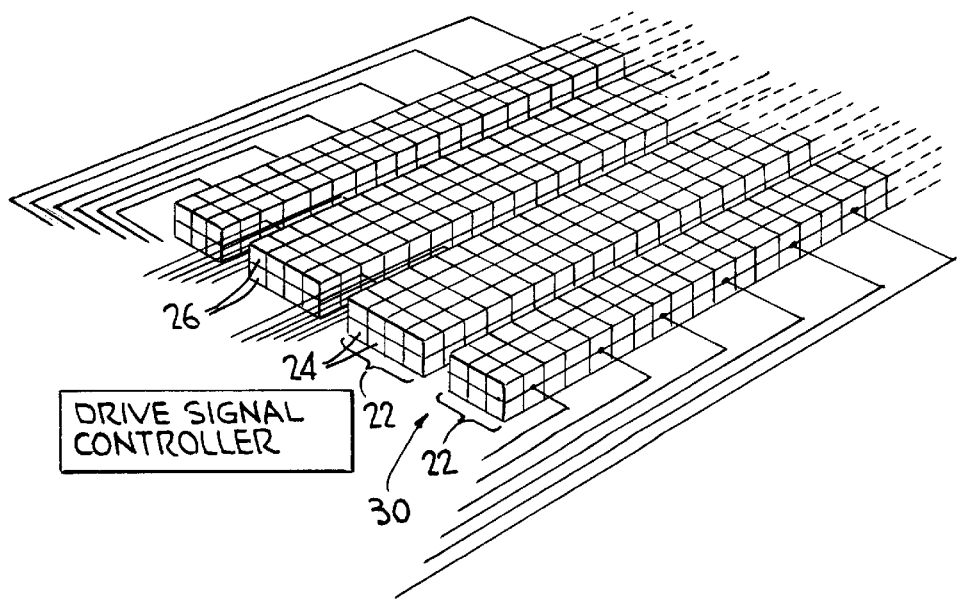
FIG. 2(b)

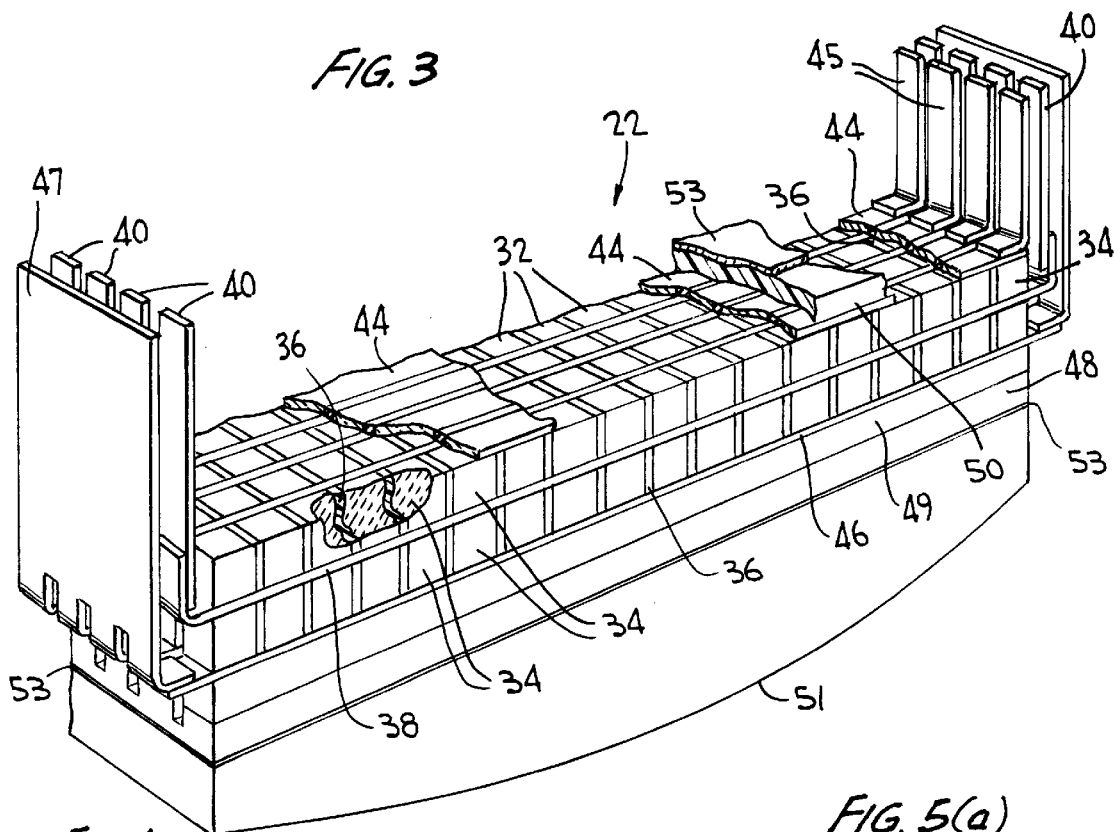
FIG. 3
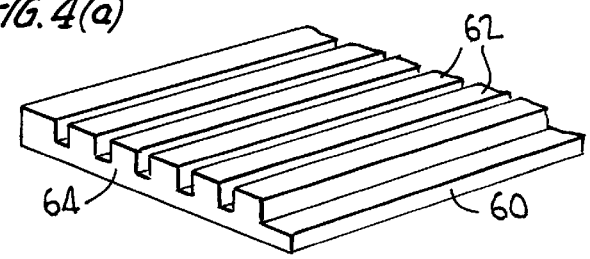
FIG. 4(a)
FIG. 4(b)
FIG. 5(a)
INJECTION-MOLD
PZT PRECURSOR;
SINTER
FIG. 5(b)
FILL & COVER WITH
POLYMER MATRIX
MATERIAL

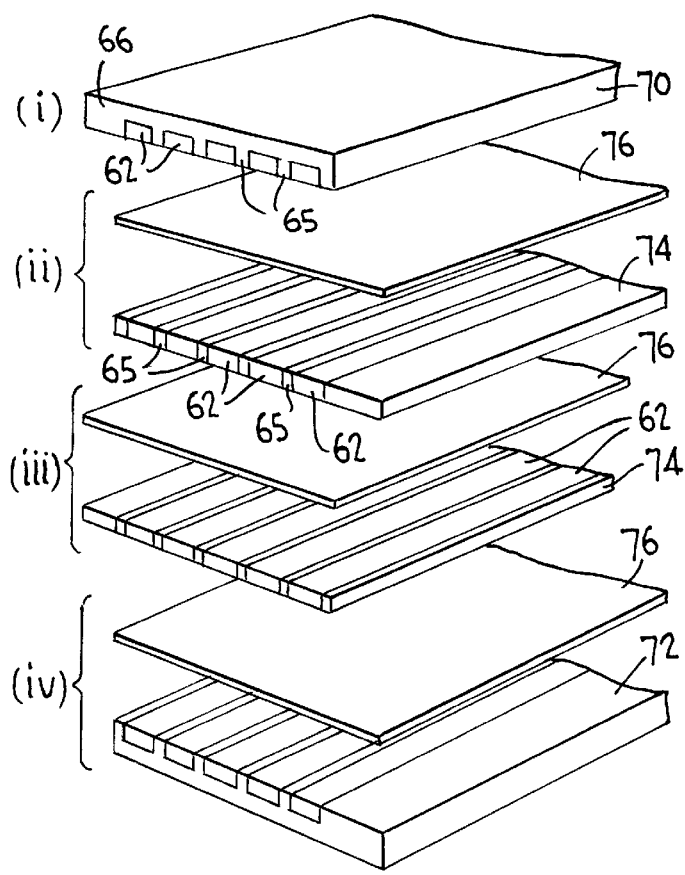
FIG. 4(c)
FIG. 5(c)
PREPARE COMPONENTS OF STACK:
(i) REMOVE PZT SUBSTRATE
(ii) REMOVE PZT AND POLYMER SUBSTRATES - METALLIZE
(iii) REMOVE PZT AND POLYMER SUBSTRATES - METALLIZE
(iv) REMOVE PZT SUBSTRATE, INVERT
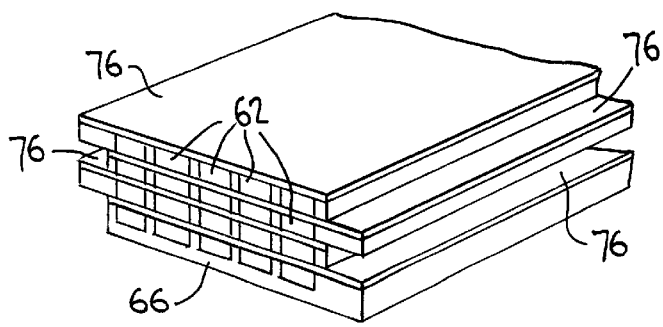
FIG. 4(d)
FIG. 5(d)
STACK OFFSET; BOND; REMOVE UPPER PZT LAYERS; METALLIZE UPPER SURFACE

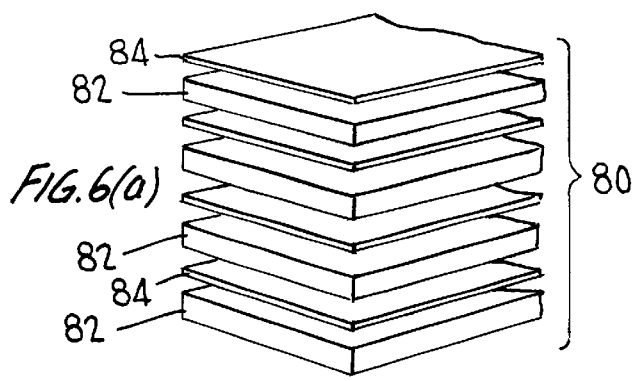
FIG. 6(a)
FIG. 7(a)
PREPARE AND SINTER PZT PLATES; PREPARE POLYMER PLATES
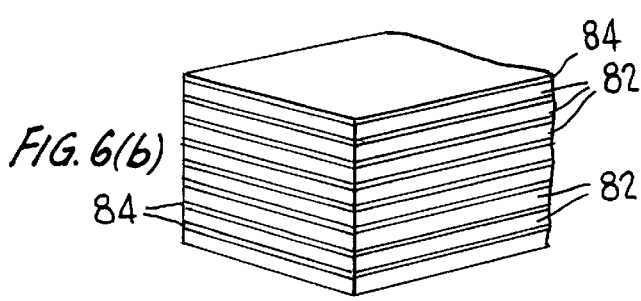
FIG. 6(b)
FIG. 7(b)
STACK SINTERED PZT PLATES WITH POLYMER; BAKE UNDER COMPRESSION AND VACUUM
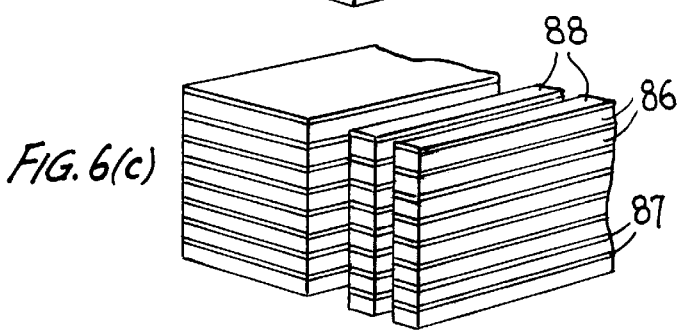
FIG. 6(c)
FIG. 7(c)
SLIT ALONG CUTTING PLANES PERPENDICULAR TO PLANE OF LAYERS
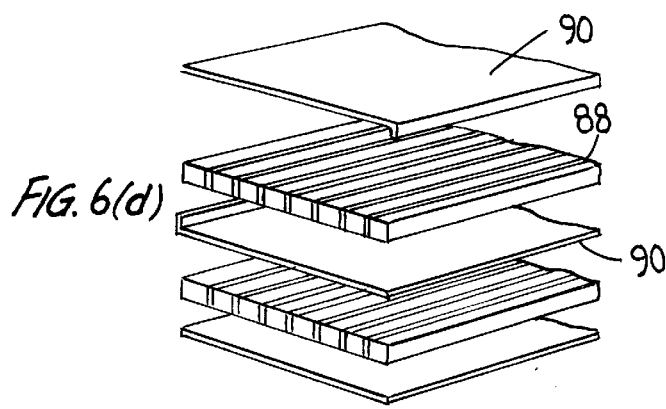
FIG. 6(d)
FIG. 7(d)
ADD CONDUCTOR LAYERS TOP AND BOTTOM; STACK
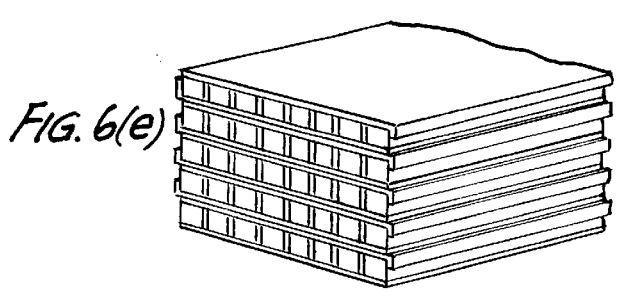
FIG. 6(e)
FIG. 7(e)
COMPRESS AND BOND

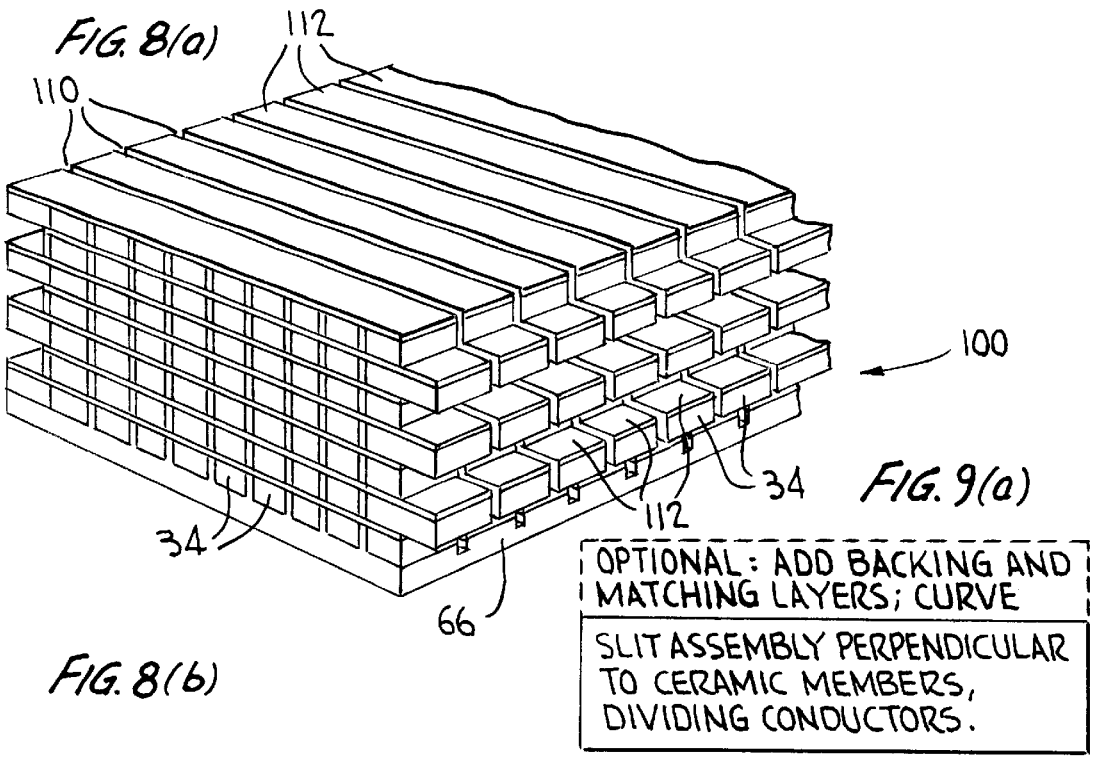
FIG. 8(a)
FIG. 8(b)
OPTIONAL: ADD BACKING AND MATCHING LAYERS; CURVE
SLIT ASSEMBLY PERPENDICULAR TO CERAMIC MEMBERS, DIVIDING CONDUCTORS.
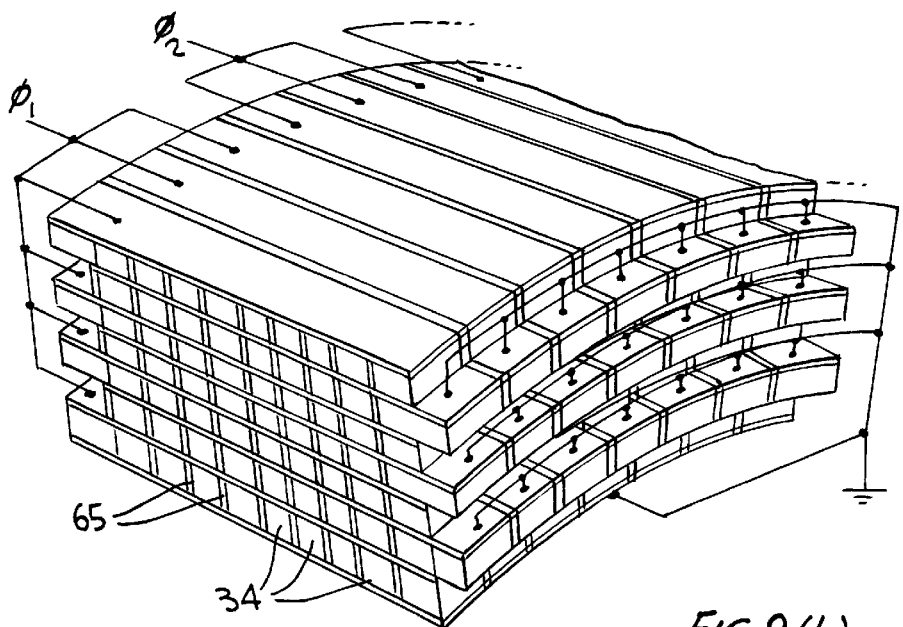
FIG. 9(a)
FIG. 9(b)
CURVE AS DESIRED; FILL KERFS WITH POLYMER MATERIAL; REMOVE LOWERMOST POLYMER LAYER; METALLIZE; MAKE ELECTRICAL CONNECTIONS.

COMPOSITE AUTOCLAVABLE ULTRASONIC TRANSDUCERS AND METHODS OF MAKING

FIELD OF THE INVENTION

This invention relates to improvements in composite ultrasonic transducers and methods of making the same. More specifically, the invention relates to reliable methods of making ultrasonic transducers of reduced electrical impedance, and transducers which can be sterilized by steam autoclaving.

BACKGROUND OF THE INVENTION

Ultrasonic transducers have been in use for some years, and are particularly useful for medical imaging. In typical ultrasonic imaging practice, a multi-element transducer is physically pressed against the skin of a patient, or against an organ to be imaged. Pulses of high frequency electrical energy applied to the elements of the transducer cause ultrasonic energy to be transmitted into the body part to be imaged. The ultrasonic energy is reflected back toward the transducer at the interfaces between various structures in the body. After transmission of the pulses of ultrasonic energy, the transducer is operated in a "receive mode" wherein the transducer elements provide electrical signals in response to detections of the reflected energy. These electrical signals can be used to display an image on a video terminal including visible "clues" corresponding to the shape of the interfaces, and thus to the structure within the patient's body.

The transducers employed in ultrasonic imaging instruments are a subject of intense research and development activities, as is the associated signal generation and processing equipment employed to generate the drive signals and to process the received signals, so as to provide increasingly more detailed and readily interpreted images. More particularly, it is known to use multiple-element transducers, each of the elements being individually electrically addressed, so that the timing of the drive signals applied to each of the elements can be separately controlled. In this way, for example, an ultrasonic beam emitted by a group of elements can be focused at a desired depth in the structure, or steered in a desired direction. This practice allows structures disposed some distance from the transducer to be imaged. Commonly assigned U.S. Pat. No. 5,503,152 discusses the formation of such focused beams in detail, and also discloses methods whereby three-dimensional images can be generated.

Typical ultrasonic transducer elements are piezoelectric members formed of a wide variety of ceramic and crystalline materials. Various species of lead-zirconate-titanate (PZT) ceramics are currently the most popular piezoelectric materials for ultrasonic applications. Particular PZT materials of interest includes those known as PZT-5H, PZT-5A, PZT-4, and PZT-8. Other materials generally equivalent to PZT ceramics for the purposes of this application (where not otherwise specified) include single crystal relaxors, such as so-called PZN-PT materials, and biased electrorestrictor materials including the so-called PMN-PT ferroelectric relaxor materials. Typical compositions of these materials and suitable techniques for their processing are well known to those of skill in the art.

Piezoelectric ceramic members are typically formed by casting a slurry, comprising powders of the materials of the desired ceramic composition in a liquid polymer binder, to a desired form, followed by high temperature heat treatment of the "green" product to bake out the polymer binders and the like, and sinter the powder materials to form a ceramic. Blocks or rods thus formed can then be sliced into plates and further processed. A tape casting process providing a flat "green" tape is also known; see commonly assigned U.S. Pat. No. 5,359,760. It is also generally known that piezoelectric materials can be injection molded to form green "preforms" of relatively complex shapes, which are then similarly sintered to form ceramic members. Usefully high tolerances can be held in this process.

After sintering, the piezoelectric property is imparted to the ceramic material by "poling", i.e., by application of an electric field of a few hundred volts thereto, causing the polar ceramic molecules to be aligned in a desired direction.

Such poled piezoelectric materials have the property that when a high frequency signal (typically 3.5 MHZ) is applied thereto, the material physically oscillates, emitting acoustic energy. When reflected ultrasonic energy reaches the transducer, e.g., after reflection at an interface within a patient's body, the inverse effect is observed; that is, an electric signal is generated in response to physical oscillation of the transducer by the returned energy. These signals can be processed to yield an image of the reflecting interfaces.

When used for medical imaging purposes, the transducer must be designed for efficient transmission of the ultrasonic energy into a patient's body. The art recognizes that it would in general be desirable to reduce the size of individual transducer elements, to increase the resolution possible in the images. It is also generally desirable to reduce the acoustic impedance of the individual elements to improve the coupling efficiency, i.e., to improve the efficiency of transmission of the acoustic energy from the transducer into the patient's body. See generally Saitoh et al U.S. Pat. No. 4,958,327. Reduction in acoustic impedance, which can be accomplished by providing less ceramic material in a given element, also broadens the bandwidth of the transducer, i.e., broadens the band of frequencies within in which the transducer is useful.

The art also teaches that it would be beneficial to subdivide each individually addressable transducer element into a one- or two-dimensional array of commonly excited active emitters separated from one another by a polymer matrix or the like, and also that it is desirable to provide each emitter as a stack of two or more individual piezoelectric members electrically connected in parallel but operating acoustically in series. That is, the transducer may desirably comprise a one- or two-dimensional array of individually-addressed "elements"; each element desirably comprises a composite one- or two-dimensional array of active "emitters" in a polymer matrix, which are excited simultaneously, so that the entire surface of each composite element moves at once to emit ultrasonic energy; and each emitter may comprise a stack of two or more individual piezoelectric "members". See, for example, the inventor's Ph.D. thesis, "Analysis and Development of Piezoelectric Composites for Medical Ultrasound Transducer Applications", The Pennsylvania State University (May 1991), at pp. 63 and 84; Howarth, "Active Underwater Acoustic Attenuation Coatings", Ph.D. thesis, The Pennsylvania State University, August 1991, at pp. 119–120; and Smith U.S. Pat. Nos. 5,329,496 and 5,548,564.

There are a number of reasons why it is desirable to subdivide each element into a number of individual emitters operated simultaneously, that is, in addition to reducing the overall size of the individually-addressed transducer elements to provide improved resolution in the image generated. As noted, reducing the relative volume of the ceramic material in an element of given size reduces the acoustic impedance, more closely matching that of a patient's body, so that the ultrasonic energy is transmitted into the body more efficiently, i.e., increasing the coupling efficiency. Forming each transducer element as a number of smaller emitters in a polymer matrix also reduces lateral vibration modes, i.e., the ultrasonic energy generated in response to the high frequency excitation signal is then emitted principally in the direction of the examination, that is, into the body of the patient, rather than being transmitted laterally in the plane of the array of elements comprising the transducer, resulting in interfering modes, increased cross-talk, and a loss of usable energy.

However, a countervailing consideration is that reduction in the size of individual emitters, particularly when replacing a monolithic element with a two-dimensional array of commonly-driven individual emitters in a polymer matrix, reduces their electrical capacitance and correspondingly increases their electrical impedance. Increasing the electrical impedance is undesirable because this increases the amount of electrical energy required to transmit a given amount of acoustic energy into the patient, and results in large signal losses in cables connecting the transducer to the associated processing circuitry. As noted, increasing the size of each element would lower its electrical impedance, but would reduce the resolution of the ultimate image, which is highly undesirable.

The art recognizes that the capacitance of individual emitters can be increased and their electrical impedance reduced if each emitter comprises a number of individual piezoelectric members, bonded to one another so as operate acoustically in series (so that their acoustic energy output is effectively summed) but connected electrically in parallel, to increase their capacitance. See, for example, the Ph.D. theses and Smith patents discussed above. More particularly, the capacitance increases as the square of the number of individual elements connected in parallel.

In particular, the two Smith patents and the two Ph. D. theses referred to above all teach transducers wherein each element includes a number of emitters spaced from one another in two dimensions in a polymer matrix (this being referred to as a 1–3 composite), and wherein each emitter comprises a stack of individual ceramic members connected in parallel. However, the only process for making such transducers taught by these references involves stacking the individual ceramic members of the emitters; this would be far too complicated for reliable production at reasonable cost. Furthermore, stacked composites built according to the Smith patents comprise planar continuous electrodes between the layers of individual ceramic members. Typical metallic electrode materials are considerably more dense and stiff than the polymer phase and will interfere with the free vibration of the composite when the relative amount of the metal in the composite becomes too great.

A further important consideration with respect to making a multiple-element ultrasonic transducer useful for medical imaging purposes is that the transducer must be sterilized in order to be used for medical applications. Conventional processes used to sterilize ultrasonic transducers involve low temperature liquid chemical sterilants, in which the transducers must remain for several hours to comply with the protocols in effect, or exposure to gas sterilants, after which the transducer must be "degassed" for up to 24 hours. The time-consuming nature of these low-temperature sterilization protocols necessitates that several costly transducers must be maintained for each operating suite. By comparison, most surgical instruments are sterilized much more rapidly by steam autoclaving, necessarily exposing the instrument to relatively high temperatures.

Although an ultrasonic transducer that could thus be steam-sterilized would be highly desirable, the art has thus far failed to provide a steam-autoclavable ultrasonic transducer, for a number of reasons.

More specifically, piezoelectric transducer elements lose their effectiveness if they are heated beyond the so-called "Curie temperature", at which the piezoelectric material becomes totally de-poled and loses its efficiency. Partial depoling occurs at lower temperatures, and is cumulative; accordingly the transducer will lose its piezoelectric property over repeated exposure to temperatures lower than the Curie temperature. While numerous piezoelectric materials have Curie temperatures high enough to allow repetitive steam autoclaving, the most commonly used piezoelectric material, e.g. PZT-5H, does not: PZT-5H has a Curie temperature of 193° C., and exhibits an unacceptable degree of depoling at the usual steam autoclaving temperature of 140° C.

The design of a transducer intended for steam autoclaving is further complicated by the composite nature of the transducer. The materials of the matrix within which the individual emitters of the transducer elements are disposed must be resistant to high temperatures and humidity encountered in the autoclaving process. Furthermore, the transducer and its elements must be designed such that differential thermal expansion exhibited by the ceramic elements, the material of the matrix, the conductors by which connections are made to the other elements of the imaging system, and the other components of a complete transducer, does not cause the transducer assembly to delaminate or otherwise be destroyed by shear stresses experienced during the high temperature autoclaving process.

OBJECTS AND SUMMARY OF THE INVENTION

Therefore, it is an object of the invention to provide a reliable and not excessively expensive process for producing multiple-element ultrasonic transducers, wherein each transducer element comprises a number of acoustic emitters separated from one other in one or two dimensions by a polymer matrix, and where each emitter itself comprises a stack of individual ceramic members, each provided with electrical connections such that the members of the elements can be connected in parallel and simultaneously excited.

It is therefore a further object of the invention to provide an improved ultrasonic transducer wherein each element comprises a number of emitters spaced from one another by a polymer matrix, and wherein each emitter in turn comprises a column of stacked ceramic members adapted to be connected electrically in parallel.

It is a further object of this invention to provide a transducer comprising layered composite emitters in a polymer matrix, having inter-layer electrodes which are not continuous planar members, thus substantially reducing the amount of metallic electrode material in the composite with respect to composites according to the prior art.

Furthermore, it is an object of the invention to provide an ultrasonic transducer that can resist high temperatures and humidity, so as to be rapidly sterilizable by conventional steam autoclaving techniques.

The present invention provides an improved transducer and elements therefor and a method of making these elements which is more reliable and less expensive then that shown in the Smith patents and other prior art referred to above. A number of planar precursors, each comprising elongated strips of ceramic material separated from one another by a polymer material, are stacked one above another so that the elongated ceramic strips are aligned with one another, with planar electrical conductors disposed between and bonded to each of the opposed planar precursors. The stack of precursors are then bonded to one another, forming a bonded assembly. The bonded assembly is then slit along parallel lines perpendicular to the direction of elongation of the ceramic strips, subdividing the elongated ceramic strips into stacked individual members, and simultaneously subdividing the planar conductors into strip-like conductors extending between opposite sides of the array. The saw kerfs remaining after slitting are then filled with a hardening polymer material, so as to complete the matrix within which the emitters are located. The strip-like conductors reaching the edges of the assembly are then connected electrically in parallel. Using this technique, an entire transducer can be formed of a single stack of planar precursors; moreover, the strip-like conductors thus formed between the layered composites meet the objective of avoiding continuous planar electrodes.

The planar precursors comprising parallel elongated ceramic strips spaced by the polymer material can be formed in either of two ways, each including several alternatives. In a first method, a monolithic ceramic member comprising a number of parallel strips formed integrally with an underlying planar support member is formed by injection molding, or by machining grooves in a block of the ceramic material. The polymer material is then cast over the monolithic ceramic members so as to fill in the spaces between the parallel ceramic strips, and also form a planar polymer layer. Depending on the ultimate position of the planar precursor in the bonded assembly, one or both of the planar polymer layer and the planar ceramic support member are removed by lapping, grinding, or the like, leaving a number of spaced parallel ceramic strips separated from one another by the hardened polymer material. The precursors are then metallized and bonded to one another, with the ceramic strips aligned, forming a bonded assembly.

In an alternative construction, the planar precursors may be formed by first forming planar tapes of the ceramic material and the polymer material, for example, using methods disclosed in commonly assigned U.S. Pat. No. 5,359,760. These may be stacked alternatingly with one another and compressed and bonded to form a solid laminated assembly. This assembly can then be slit transversely, forming slabs comprising alternating elongated strips of the ceramic and polymer materials. These slabs can then be metallized, stacked with the ceramic strips aligned, and bonded to another to form the bonded assembly.

As noted, the bonded assembly is then slit perpendicular to the direction of the elongated ceramic strips, subdividing these into individual ceramic members, and simultaneously dividing the planar conductors into ribbon-like conductors extending between opposed edges of the assembly. The assembly can be curved at this stage, if desired, or earlier in the fabrication process. The final configuration of the assembly is then fixed by filling the kerfs remaining after the slitting operation with a hardening polymer. Backing and matching layers can be added before or after the slitting step, depending on the configuration desired. Connection of the strip-like conductors which run between the columns of juxtaposed ceramic members making up the individual emitters may be accomplished in several ways.

According to a further important aspect of the invention, a steam autoclavable transducer is manufactured using a piezoelectric material which will not depole upon repeated exposure to temperatures encountered in autoclaving, polymer matrix materials having a glass transition temperature higher than the temperatures encountered in autoclaving, and electrode materials sufficiently malleable to withstand temperature-induced shear stresses encountered in autoclaving, and by cooperative selection of the ceramic volume fraction and ceramic and matrix materials with respect to their thermal coefficients of expansion and elasticity, so as to avoid delamination upon autoclaving. A moisture barrier may further be incorporated.

BRIEF DESCRIPTION OF THE DRAWINGS

The invention will be better understood if reference is made to the accompanying drawings, in which:

FIG. 1 shows a side view of a typical arrangement for use of an ultrasonic transducer;

FIG. 2, comprising FIGS. 2(a) and 2(b), shows perspective views of the piezoelectric components of transducers comprising one and two-dimensional arrays of elements, respectively, and shows schematically the electrical connections that are made thereto;

FIG. 3 shows a rear view of a single element of a transducer according to one embodiment of the invention;

FIG. 4, comprising FIGS. 4(a) through (d), shows perspective schematic views illustrating the sequence of steps in a first method of forming the planar precursor members and bonded assembly according to the invention;

FIG. 5, comprising FIGS. 5(a) through (d), includes a corresponding sequence of verbal descriptions;

FIG. 6, comprising FIGS. 6(a) through (e), shows perspective views similar to those of FIG. 4, and illustrating the steps in a second method of forming the planar precursor members according to the invention, and of the bonded assembly;

FIG. 7, comprising FIGS. 7(a) through (e), shows a corresponding sequence of verbal descriptions;

FIG. 8, comprising FIGS. 8(a) and (b), illustrates two steps in the completion of the transducer according to the invention; and FIG. 9, comprising FIGS. 9(a) and (b), provides a corresponding sequence of verbal descriptions.

DESCRIPTION OF THE PREFERRED EMBODIMENTS

As mentioned, FIG. 1 shows an ultrasonic transducer 10 juxtaposed to a patient's body 12 for examination thereof. The transducer 10 comprises a number of individual piezoelectric elements 14. As discussed in further detail in commonly assigned U.S. Pat. No. 5,503,152, a sub-set 16 of elements 14 is typically excited by sequential application of bursts of high frequency signals thereto to emit a focused beam 18 of ultrasonic energy into the patient's body. The focused beam 18 of ultrasonic energy is reflected at the interfaces between structures in the body and reflected back toward the transducer 10. When the elements 14 are physically oscillated by the reflected ultrasonic energy, they emit voltages which can be amplified and processed in known fashion to yield an image of the interfaces, thus revealing various conditions of interest to a trained eye.

FIG. 2(a) shows a one-dimensional transducer array 20 made up of a number of elements 22. Each element 22 is separately addressable by a drive signal controller. For example, elements 22 can be caused to emit pulses of ultrasonic energy in sequence, so that the sum of the pulses is focused at a desired depth from the transducer; see commonly assigned U.S. Pat. No. 5,503,152. According to the present invention, each element 22 is made up of a two-dimensional array of individual active emitters 24 in a polymer matrix. Each emitter 24 further comprises several individual stacked piezoelectric members 26, two in the embodiment shown. All of the members 26 of all of the emitters 24 of each element 22 are driven simultaneously.

FIG. 2(b) shows a transducer 30 comprising a two-dimensional array of individual elements 22, each again comprising a number of emitters 24, each again comprising one or more individual piezoelectric members 26. The elements 22 are separately addressable by a drive signal controller; this would allow, for example, focusing of the sum of the pulses in two dimensions.

The precise nature and relation of the signals used to drive the transducers are controlled by a drive signal controller responsive to user commands. Again, details of the manner in which these signals may be provided, and the analysis of the return signals to provide a useful image, are discussed in commonly-assigned U.S. Pat. No. 5,503,152.

The present invention relates to manufacture of improved transducers 10 and, in particular, to methods of fabrication of improved transducer elements and entire transducers, and of autoclavable transducers.

Components of Improved Transducers

A perspective rear view of a single transducer element 22 according to one embodiment of the invention is shown in FIG. 3. The overall transducer 10 may comprise a single row of the rectangular transducer elements 22 of FIG. 3, that is, a one-dimensional array of elements 22, as shown in FIG. 2(a), or may comprise a two-dimensional array of individual elements, as shown in FIG. 2(b).

Each transducer element 22 is made up of a number of individual emitters 32 spaced from one other by a matrix 36 of a hardening polymer material, typically one or more of epoxy, silicone rubber, polyurethane or the like. Such an assembly is referred to in the art as a 1–3 composite. As discussed in detail below, the matrix 36 is provided in two separate steps, such that different polymer materials may be employed for the components of the matrix extending in different directions.

In the embodiment shown, the element 22 comprises an array of four rows each of eighteen emitters 32, and each emitter 32 in turn comprises two stacked ceramic members 34. As mentioned above, the capacitance of the stacked emitters is increased by the square of the number of individual members 34 of each emitter connected in parallel. As two elements are stacked in this embodiment, their relative capacitance is increased by a factor of four, and their electrical impedance similarly reduced. It will be appreciated that the invention is not to be limited by these specifics. In particular, each transducer element may include a single row of individual emitters 32.

In order that the individual ceramic members 34 of each element 22 can all be excited simultaneously, and so that their capacitance can be increased, members 34 must be connected in parallel, that is, each individual member 34 must be electrically connected directly to the signal source and ground. To facilitate this, a central conductor 38 extends between and is bonded on its opposite faces to the pairs of the individual members 34 of each of the emitters 32. The high frequency drive signal is applied to connecting members 40 soldered to the conductors 38 at either end. The front and rear surfaces of the array of emitters 32 are contacted by planar conductors indicated generally at 44 and 46. Planar conductors 44 and 46 are typically connected to ground by connectors 45 and 47 respectively soldered to the planar conductors 44, 46. As mentioned, the drive signal is applied to connector 40 at either or both ends of the rows of emitters 32 making up the elements 22 of the array. Where it is desired that each emitter comprise more than two ceramic members, the connecting conductors are multiplied accordingly.

In this way, each of the individual piezoelectric ceramic members 34 is directly connected to the signal and to ground, such that members 34 are connected electrically in parallel, while being coupled acoustically in series. This increases the coupling constant, increases the capacitance, and reduces the electrical impedance of the emitters 32, all as specified above. Further, as will be discussed in detail below, providing the emitters as columns of ceramic members separated from one another in two dimensions by the polymer material of the matrix, allows substantial heating, e.g., during autoclaving, without destroying the assembly due to stresses caused by differential thermal expansion of the various components.

The transducer is completed by inner and outer impedance matching layers 48 and 49, and backing layer 50, discussed further below. The entire transducer may be provided with a moisture barrier 53 of aluminum foil or the like; conductors 40, 45, and 47 would protrude through holes in layer 53 and be sealed thereto. A lens 51 of a solid material, e.g., molded polymer may also be provided, as shown.

It will be appreciated by those of skill in the art that in order for this assembly to function properly, in particular for reduced capacitance to be exhibited, the individual piezoelectric ceramic members 34 making up columnar emitters 32 must be aligned one above the other and must be connected properly to conductors 38 extending therebetween. While emitters 32 can be assembled from individual members 34, as suggested by the Smith patents and Howarth thesis, e.g., to fabricate a prototype for experimental purposes, this technique is essentially unsuited for commercial production; it will be appreciated that the individual members of a practical transducer may be on the order of as little as 25 to 200 microns in cross-sectional dimension, or smaller, and must be accurately aligned over the entire transducer, which will typically have overall dimensions on the order of 10 by 100 millimeters, or larger.

More particularly, a one-dimensional transducer 20 as illustrated in FIG. 2(a) may comprise a single row of on the order of 100 transducer elements 22, which can all be formed simultaneously according to the invention. Each element is typically on the order of 0.4 mm deep by 7 mm wide, so that the transducer 10 comprising a row of 100 elements 22 is 7 mm wide by 40 mm long. The 100 elements 22, each comprising one or more rows of 20–50 individual emitters, are formed simultaneously to ensure mechanical and electrical uniformity. Separate electrical connections are provided to each element 22, so that the desired sequence of excitation signals can be applied to one or more selected transducer elements 22 at any given time. However, it should be understood that the principles of the invention are not thus limited, and that transducers having two-dimensional arrays of multiple-emitter elements (as shown in FIG. 2(b)) could also be fabricated using the techniques of the invention.

Fabrication of Improved Transducers

As summarized above, the method of manufacture of transducer elements 22 according to the invention commences with the fabrication of a number of composite planar precursors equal to the number of members 34 desired to make up each emitter 32. Each planar precursor comprises a number of parallel elongated ceramic strips spaced from one another by members of a hardening polymer material. The number of elongated ceramic members is equal to the number of individual emitters in each row of each element. Note that this number need not be precisely controlled, substantially simplifying manufacture of the transducer.

The composite planar precursors are then stacked such that the ceramic strips of each are aligned with respect to one another, and are bonded to one another by way of interleaved planar conductive members, e.g., provided by metallizing one or both faces of each planar precursor, forming a bonded assembly. This bonded assembly is then slit transversely to divide each of the elongated ceramic strips into individual ceramic members, and to simultaneously cut the planar conductors into ribbon-like members. The ribbon-like conductors contact each of the individual ceramic members, so that the individual members of each columnar emitter can be connected in parallel. The kerfs left by the slitting process are then filled with a polymer material, completing the ceramic/polymer composite matrix.

As discussed in further detail below, by appropriate selection of the ceramic and polymer materials with respect to their relative properties and proportions, and with attention to selection of the materials of the conductors, the transducer thus formed can be rendered stable under the temperatures encountered in autoclaving.

FIGS. 4 and 5 detail one method of manufacturing this bonded assembly, FIGS. 6 and 7 show a second method thereof, and FIGS. 8 and 9 show the principal steps required to complete the manufacture of the transducer according to the invention.

Referring first to FIGS. 4 and 5, in this process, a PZT precursor shown at 60 in FIG. 4(a) is injection molded. Injection-molded ceramic elements are available commercially from Materials System, Inc., of Littleton, Mass. More specifically, a slurry or other castable material comprising powders of the constituents of the desired PZT (or other piezoelectric) compound in a polymer binder is placed in an injection mold having a reverse of the shape shown, and processed so as to hold its form long enough to be sintered. This "green preform" is then sintered by high temperature heat treatment in an appropriate atmosphere, volatilizing the polymer binder, while the constituent powders react with one another to form a solid member of the PZT ceramic material. In the shape shown, the ceramic members include a number of elongated parallel strips 62 integrally joined by a planar member 64 of the same material. Alternatively, a block of presintered PZT could be grooved with a dicing saw or the like to form strips 62.

As shown in FIGS. 4(b) and 5(b), the next step is to fill the spaces between the strips 62 and the area above strips 62 with a hardening polymer material, such as an epoxy, silicone rubber, polyurethane, or the like, so that the parallel elongated PZT strips are spaced from one another by strips 65 of the polymer and so that this composite is stabilized by planar polymer member 66.

A number of the PZT/polymer composite assemblies of FIG. 4(b) are then processed somewhat differently, depending on their intended location in the bonded assembly formed next. Thus, as shown in FIGS. 4(c) and 5(c), an uppermost composite member 70 will be processed by having the planar PZT member 64 removed, e.g., by a conventional lapping process, forming a planar precursor having a number of elongated ceramic strips 62 separated by the polymer strips 65, and further stabilized by the planar polymer member 66. A similar planar precursor 72 may form the lowermost component of the bonded assembly. Interspersed between upper and lower members 70 and 72 are one or more further planar precursors 74, having each been processed to remove the planar portion 66 of the polymer material and the planar portion 64 of the PZT material, thus leaving the elongated ceramic strips 62 spaced by the polymer strips 65.

These planar precursors 70, 72, 74 are then interspersed by planar conductive layers 76. Conductive members 76 may be discrete members, as shown for clarity, but are preferably metal layers applied directly to the ceramic/polymer precursors 70, 72, 74.

More particularly, the conductive layers 76 may preferably be one or more thin layers of several metals. The application process may vary with the metal and the thickness of the layer. For example, the first layer to be applied may be a 500–1000 Angstrom (0.05–0.1 micron) coating of chromium, applied by sputtering. The chromium layer, applied to ensure adhesion of the successive layer, is followed by a 0.1–1.0 micron vapor-deposited layer of copper, followed in turn by a 1–10 micron layer of copper applied by electro- or electroless plating, provided for electrical conduction and for malleability. This may be followed by a thin plated layer of nickel or gold, to prevent oxidation of the copper, and to ensure good bonding of the juxtaposed precursors 70, 72, 74 upon application of pressure. Depending on the scheme chosen for connection of the conductive layers (discussed below), the opposed edges of the precursors may be coated as well, followed by partial removal to isolate opposite faces of the precursors from one another.

The completed stack of precursors is shown in FIG. 4(d). As indicated above, it is extremely important that the individual elongated ceramic strips 62 be aligned with one another, as shown, so that the individual members 34 subsequently formed are aligned to form columnar emitters 32 exhibiting increased relative capacitance. The alignment of strips 62 can be rendered more reliable if the two or more planar precursors which are stacked are all formed from a single elongated ceramic member, filled with polymer material, and cut transversely into individual precursors which are then stacked in "book-matched" fashion. In this way, any irregularity in the width or spacing of the elongated ceramic strips is identically repeated in each of the precursors making up the stack, so that the individual strips are correctly aligned. If processed in this way, a degree of randomness in the width and spacing of strips 62 can be introduced conveniently; this randomness helps to avoid unwanted resonances which might introduce harmonics in the ultrasonic energy transmitted.

It may be convenient to provide additional width to the last strip of the polymer material on opposite edges of alternate ones of the planar precursors 70, 72, 74, as shown, to expose a portion of alternate layers of the conductive material 76 on the edges. This enables connections to be conveniently made thereto, as shown in connection with FIG. 9.

The assembly shown in FIG. 4(d) is then treated to bond the conductive members together, e.g., heated under conditions such that the interspersed conductive layers are bonded to one another, forming a solidly bonded member. The uppermost planar polymer member 66 (as shown in FIG. 4(c)) may then be removed and the upper surface metallized, as indicated in FIG. 4(d). The lower polymer member 66 may be retained for the time being, to retain integrity of the bonded assembly during transverse slitting, as discussed below in connection with FIG. 8. Alternatively, the continuous ceramic member formed integrally with the strips 62 of the lowermost planar precursor may be retained for the same reason. Further alternatives include forming all of the precursors of the stack in the form of precursors 72, i.e., without continuous polymer or ceramic layers. After both top and bottom surfaces of the stack of precursors have been metallized, and before the slitting step discussed below, backing and/or matching layers may be provided. Either may be partially slit during the slitting step, so as to retain the integrity of the bonded assembly. The stack of precursors may also be compressed between curved plates while being heated above the glass transition temperature of the polymer, at which it begins to soften, if a curved transducer element is desired.

FIGS. 6 and 7 illustrate a second method of forming the bonded assembly and also illustrate a slightly different method of exposing portions of the planar conductors so as to enable electrical connections to be made thereto. It will be appreciated that either method of exposing portions of the conductors can be used with either method of forming the planar precursors.

As shown in FIGS. 6(a) and 7(a), this process begins by assembling a stack 80 of pre-sintered PZT and polymer plate members, 82 and 84, respectively. Where an entire transducer is formed integrally, these members will be the desired length of the transducer. PZT and polymer members 82 and 84 may be prepared using the detailed instructions in commonly assigned U.S. Pat. No. 5,359,760. Essentially, a "doctor blade" tape-casting process is used to form very precise tapes of PZT powders in a polymer binder. The "green" tape formed thereby is then sintered to form the desired PZT ceramic, preferably while exposed to further PZT material, so as to preclude any possible depletion of lead from the surface of the tape. A similar tape casting process is used to form the polymer members 84.

The stack 80 formed in FIG. 6(a) is then compressed and heated under vacuum, as shown in FIG. 6(b), to form a bonded assembly having PZT layers 82 interspersed with polymer members 84.

As shown in FIG. 6(c), this assembly is then slit perpendicular to the plane of the layers, forming laminated slabs 88 comprising elongated ceramic strips 86 interspersed with strips 87 of polymer material. As shown in FIG. 6(d), slabs 88 may then be metallized or otherwise provided with conductive layers 90 on either or both of their faces, using the materials and process steps discussed above. The slabs 88 are then stacked. While the slabs 88 must be properly aligned to ensure proper alignment of the strips 86, it will be appreciated that the thickness of strips 86 need not be precisely controlled to ensure their alignment. As indicated, alternate conductors 90 may extend around opposed ends of the assembly so as to be exposed for connection when the assembly is bonded. This step is indicated in FIG. 6(e), where the assembly is compressed and bonded by application of heat so that the conductors are firmly joined by one another, and to the opposed ceramic strips. Again, as discussed above, it is important that the elongated ceramic strips 86 be aligned with one another.

FIGS. 8 and 9 show the principal steps in completion of the assembly. The illustrated version is that shown made by the process of FIG. 4(d), wherein the planar precursor members have relatively wide sections of the polymer material at their edges which are offset with respect to the adjoining layers, so as to expose the edges of the planar conductors. However, essentially the same process may be used to complete the bonded assembly fabricated as shown in FIG. 6. In either case, backing and/or matching layers of polymer filled with metal or ceramic powders to control their density may be applied to metallized outer faces of the bonded assembly, as indicated in FIG. 9 (a). The array may also be heated to allow it to be curved in a desired direction.

As shown in FIG. 8(a), using a conventional dicing saw or the equivalent, the bonded assembly 100 is repeatedly slit along lines 110 perpendicular to the direction of elongation of the ceramic strips 62. Each of the elongated strips is thus separated into a number of individual ceramic members 34, and the stack of precursors is effectively divided into an array of laminated stacks of PZT members 34. Furthermore, the planar conductors (76 in FIG. 4, 90 in FIG. 6) interspersed between the stacked precursors are simultaneously slit transversely to form strip-like conductors 112 extending between opposed edges of bonded assembly 100. It will be appreciated that each of the individual ceramic members 34 is contacted on top and bottom surfaces by conductors 112.

As shown in FIG. 8(a), conveniently the slitting operation is performed without cutting through the lowermost layer of polymer material 76, so that the assembly retains its integrity during the slitting operation. As noted, a continuous slab 64 of ceramic material (see FIG. 4(a)) may alternatively be retained on the lowermost planar precursor for this purpose, and removed after slitting. (If the FIG. 6 process is used to form the bonded assembly, a lowermost polymer layer may be added to the bonded assembly for this purpose.) The continuous lowermost layer may also be chosen of a material useful to serve as a backing or matching layer; in this case the lower surface of the bonded assembly would be metallized before application of the additional polymer layer. After slitting, the assembly can be curved, so as to open or close slightly the kerfs left along slitting lines 110, forming a convex or concave transducer as desired. If curvature in the other dimension is desired, the bonded assembly of precursors can be heated sufficiently to soften the polymer, and the array formed between cooperating curved die surfaces or the like, as indicated above.

To stabilize the assembly, the kerfs left by the slitting operation are then filled with a hardening polymer material, as shown in FIG. 8(b). After the kerfs have been filled with polymer material and it has cured, integrating the assembly, any lower layer 76 of ceramic or polymer material not required in the final product can be removed, and the lower surface metallized so as to enable electrical connections to be made thereto. If not applied previously, backing and matching layers are then added, and the transducer completed as discussed above.

Both of the connection schemes shown in FIGS. 4(d) and 6(e) provide for exposure of the ends of alternating ones of the strip-like conductors 112 at opposite edges of the element. Thus, as shown in FIG. 8(b), the "odd" conductors are grounded by connection on one edge of the array, while drive signals $\phi_1$, $\phi_2$ are applied to the opposite ends of the interleaved "even" conductors. As noted, numerous other methods of connecting the conductors to one another so that a signal can be applied across all of the individual elements 34 of the array simultaneously will be apparent to those of skill in the art.

As the drive signals are thus provided directly to each of the stacked members 34 making up each emitter 32, the members of each emitter are effectively connected in parallel. The capacitance of each columnar emitter 32 comprising N stacked individual ceramic members 34 (N=7 in FIG. 8) is proportional to $N^2$, while the electrical impedance of each is proportional to $1/N^2$. Substantially improved performance is thus realized as compared to individual emitters comprising a single ceramic member.

Completion of the entire element as shown in FIG. 3 involves provision of the matching layers 48, 49, and backing layer 50, and suitably packaging the assembly. Where the entire transducer consists of a single row of elements, the conductors connected to the individual elements will typically be brought out toward the lateral sides of the array, as indicated in FIG. 3. Where a two-dimensional array is called for, the conductors would desirably be made as compact as possible to minimize the space between adjacent elements.

As mentioned above, it is desirable to form all the stacked multiple-element emitters in a way eliminating any necessity of stacking microscopic components, as in the Smith patents. The method of the invention does so. Furthermore according to the method of the invention, all the elements of the transducer can be formed in a single sequence of steps, insuring that the elements are all perfectly aligned with one another, and so that the entire assembly exhibits uniform electrical characteristics. Essentially, the precursors and assemblies shown in FIGS. 4, 6, and 8 can simply be extended to equal the overall length of the transducer assembly desired, and the individual rows of columnar emitters created in the slitting operation of FIG. 8(*a*) connected in common as needed. This is indicated in FIG. 8(*b*) wherein different signals $\phi_1, \phi_2, \ldots \phi_n$ are shown, each being connected to three rows of emitters 32. In this case, the first three rows of individual emitters 32 would be excited simultaneously, thus comprising a single individually-addressed transducer element, as would the elements of the second three rows, and so on.

Finally, it is to be noted that the method of the invention, particularly if the FIG. 4 process is adopted, involves only the single slitting step shown in FIG. 8(*a*); reduction in slitting steps is desirable, as the slitting process is time consuming and relatively delicate. The process of the invention also avoids the necessity of lapping continuous ceramic members, which can be difficult, as acknowledged in commonly assigned U.S. Pat. No. 5,359,760. Lapping of the FIG. 4(*b*) composite to remove the planar ceramic amd polymer slabs is not difficult.

Autoclavable Transducers

As mentioned above, in order that an ultrasonic transducer can be steam-autoclavable, as is highly desirable, the transducer must be resistant to high temperature and humidity. This requires both that the materials of the transducer retain their mechanical and electrical properties after repeated exposure to high temperature steam, and also that the array retain its mechanical integrity.

More specifically, during heating all materials expand somewhat, by a value termed the thermal coefficient of expansion (TCE), expressed herein as parts per million of length per degree Celsius (ppm/°C.). TCE's of materials typically used in ultrasonic transducers vary substantially, as shown by the following table:

TABLE

| Material | TCE (ppm/°C.) |
|---|---|
| PZT Ceramic | 3 |
| Aluminum (for moisture barrier) | 14 |
| Filled epoxy (for matching layers) | 30 |
| Filled epoxy (for backing layer) | 60 (Estimated) |
| High temperature epoxy | 63 |
| Polyurethane | 180 |

Where materials having different TCEs are bonded together, substantial shear forces can arise at their bonds during heating, depending on their dimensions and on the relative shear stiffness of the materials. Bond failure, typically delamination, is comparatively likely where members of two relatively stiff materials, e.g., PZT and aluminum, are bonded together; by comparison, where one material is relatively less stiff, e.g., in an epoxy/aluminum bond, bond failure is much less likely. Moreover, of course, the total force exerted on a given bond is proportional to its length. Hence both material selection and bond design are highly relevant to bond integrity during autoclaving of an ultrasonic transducer.

As noted in detail above, the composite arrays formed according to the method of the invention include individual piezoelectric emitters spaced from one another in two dimensions by a polymer matrix. This construction is sometimes referred to in the art, and hereinafter, as a 1–3 composite.

The ceramic elements of each row of elements in the 1–3 composite of the invention are bonded to a continuous strip-like metallic conductor running transverse to the direction of elongation of the transducer, that is, in the long direction of FIG. 3. If these conductors are formed to be thin, are well bonded to the composition, and if relatively malleable metals are selected, there is little tendency for the conductors to delaminate from the composite.

A more serious possible problem of delamination occurs where the backing and matching layers meet the composite. Again, while conductors are interleaved between the outermost surfaces of the composite and the backing and matching layers, the conductive layers are so thin that their relatively lower TCEs do not contribute substantially to the net shear forces exhibited at these interfaces. Moreover, as discussed below, the conductors are preferably formed of relatively malleable materials which can be somewhat deformed at the interfaces without delamination.

As indicated in the table above, typical backing layer materials have a TCE of 60 ppm/°C., while typical matching layer materials have a TCEs of 30 ppm/°C. If a continuous ceramic material having a TCE of 3 ppm/°C. were bonded directly (or through a thin conductor layer) to a monolithic backing layer having a TCE of 60 ppm/°C., as in the table above, the difference of 57 ppm/°C. would be sufficient to render this bond liable to delamination at autoclaving temperatures. More specifically, when the temperature changes, the backing layer attempts to expand until the shear displacement produces a shear force resisting additional differential expansion. Because the ceramic is much stiffer than the backing, almost all the shear displacement occurs in the backing. Furthermore, because the shear displacement is now more evenly divided between the composite layer and backing layer, the shear stress created at the interface is reduced very substantially.

By providing the ceramic material as relatively small individual members in a polymer matrix, the TCE of the overall composite can be raised to approximately 33 ppm/°C. Moreover, the TCE of the epoxy material of the backing layer can be reduced by loading it with ceramic or metallic powders to approximately 45 ppm/°C. The differential TCE is then approximately 12 ppm/°C., which is sufficiently low that the shear forces developed are relatively small, avoiding delamination.

As mentioned, a further reduction in the tendency of the composite/conductor/backing layer bond to delaminate upon heating is achieved by use of relatively malleable materials for the conductors. For example, highly purified copper is extremely malleable, as is gold; as indicated above, a suitable conductor structure comprises a thin layer of chromium, applied for adhesion, followed by a thicker layer of copper, followed by a thin layer of gold to insure good bonding between adjacent layers in the manufacturing process. This conductor structure is relatively resistant to delamination.

Choice of the hardening polymer forming the matrix of the 1–3 composite is also significant if the transducer is to be autoclavable; specifically, the polymer should be characterized by a glass transition temperature (the temperature at which the material softens) approximately equal to or somewhat higher than the typical autoclaving temperature. Epoxies such as Epotek 353ND available from Epoxy Technology, Billerica, Mass. 01821, or silicone rubbers such as No. 4210 available from NuSil Technology, Carpinteria, Calif. 93013, are suitable.

Thus, a 1–3 composite transducer having each individual ceramic element spaced from its neighbors in two dimensions by a matrix of a polymer according to the invention exhibits an overall thermal coefficient of expansion much closer to that of a loaded polymer backing or matching layer than would a monolithic ceramic element, since the expansion contribution of the polymer is much larger than that of the ceramic.

Furthermore, although the shear stress that develops at an interface between two materials having differing TCEs is not dependent on the length of the interface in first order calculations, it is still advantageous to keep the bond lengths of materials with different TCEs small. The small size allows surrounding material to compensate for the differential expansion. In the present application, even though the individual ceramic members are still bonded to materials with a much higher TCE, the bond is less likely to fail. Also, if the bond does fail at a single ceramic member the failure remains isolated; it does not cause an increase in stress in adjacent regions which would cause isolated failures to propagate into a full delamination. Thus, even though the thermal coefficients of expansion of the polymer, interleaved conductors and piezoelectric ceramic members may differ, the stresses experienced at any given bond are reduced greatly by provision of the piezoelectric members as part of a relatively "soft" composite having a low modulus of elasticity.

More specifically, it is believed adequate for providing an autoclavable ultrasonic transducer according to the invention that the overall thermal coefficient of expansion of each 1–3 composite layer differ by no more than about 30 ppm from that of the layers to which it is bonded, that is, the conductors and the backing and matching layers. If sufficient polymer is provided in the composite to reach this goal, i.e., if the volume fraction of the ceramic in the composite is sufficiently low, the composite should have a suitably low modulus of elasticity to preclude build up of excessive shear stress across the width of the conductor.

The TCE of the composite, $TCE_{comp}$, in a given direction can be expressed mathematically as follows:

$$TCE_{comp} = LF_{CER} * TCE_{CER} + (1 - LF_{CER}) TCE_{MAT}$$

where:

$LF_{CER}$ is the linear fraction of the ceramic, i.e., the percentage of ceramic present in the ceramic/polymer composite, measured along a line;

$TCE_{CER}$ is the TCE of the ceramic material; and $TCE_{MAT}$ is the TCE of the polymer material of the matrix.

It is thus an aspect of the invention to design the composite such that $TCE_{comp}$ is within about 30 ppm/°C. of the TCEs of the conductors and matching and backing layers to which the composite is bonded.

It is within the scope of the invention to provide an autoclavable transducer having a single 1–3 composite layer. However, provision of each emitter as a columnar stack of two or more individual ceramic members connected in parallel, as discussed in detail above, is also beneficial in realizing an autoclavable transducer having useful electric and acoustic properties, in that providing each emitter as a stack of two or more members allows selection of piezoelectric materials that are relatively inefficient electrically, but can withstand the high temperatures encountered in autoclaving without depoling.

As mentioned above, providing each emitter as a multiple-layer structure with the individual ceramic members connected electrically in parallel increases the capacitance of each emitter. This allows use of ceramic materials having relatively low dielectric constants, which tend to have high Curie temperatures, and are thus capable of resisting depoling when exposed to the high temperatures encountered in autoclaving. The capacitance of single-element emitters if made of high Curie temperature materials would be too low to provide suitable electrical properties.

More particularly, the PZT-5H material normally preferred for ultrasonic applications due to its relatively high dielectric constant has a low Curie temperature of 193° C., and will become significantly depoled upon repeated exposure to the temperatures normally encountered in autoclaving, e.g., 140° C. Hence this material is not an ideal choice for an autoclavable transducer.

By providing each individual emitter as several stacked members connected in parallel according to the invention, a PZT-5A piezoelectric ceramic material having a Curie temperature of about 350° C. (and a correspondingly lower dielectric constant than PCT-5H) can be employed. Provision of each emitter as a column of two or more PZT-5A members connected in parallel using the method of the invention provides capacitance and ultrasonic performance approximately equal to a single member of PZT-5H of the same cross-sectional dimensions. Other materials having still higher Curie temperatures include PZT-4 and PZT-8.

As mentioned, choice of the electrode materials used to form the outer layers of the transducer assembly, and the conductors between the individual elements of the emitters, is also important in providing an autoclavable transducer. As noted, a malleable material such as high-purity copper may be used as one of the electrode layers, allowing some shear stress to be exerted at the interface between the ceramic elements and conductive layer without destroying the bond therebetween. A solder might also be used, or a conductive elastomer provided between the individual elements making up each emitter.

The outer electrodes may also be provided with an outer layer of a corrosion-resistant material such as nickel in order to avoid corrosion due to moisture exposure during steam autoclaving. Alternatively, the entire transducer assembly might be enveloped within a moisture barrier 53, e.g., a thin aluminum layer also providing electrical shielding. The polymer materials chosen to space the ceramic members from one another, e.g., as in FIGS. 4(b) and 6(a), should be chosen to resist high temperatures and humidity, as above. Examples are hardening epoxies and silicone rubbers having glass transition temperatures above normal autoclaving temperatures; other polymers which might otherwise form useful matrix materials, such as polyurethanes, should be avoided as these have high TCEs and do not resist the conditions encountered in autoclaving.

While a preferred embodiment of the invention has been disclosed and described in detail, it will be realized by those of skill in the art that numerous modifications and improvements can be made thereto without departure from the spirit and scope of the invention. Therefore, the invention should not be limited by the above exemplary disclosure but only by the following claims.

What is claimed is:

1. A transducer for emitting and detecting ultrasonic energy, comprising:

at least one row of individually-addressable transducer elements, extending in a first dimension;

each element comprising a plurality of piezoelectric emitters arranged in at least one row extending in a second dimension perpendicular to said first dimension, said emitters being spaced from one another by a polymer matrix;

each emitter comprising a plurality of individual ceramic members stacked in a third dimension perpendicular to said first and second dimensions, said individual ceramic members being connected to parallel elongated strip-like conductors disposed between the individual ceramic members of each emitter and extending parallel to the second dimension to reach opposed edges of said array;

adjacent ones of said elements and said emitters being separated from one another solely by continuous planar members of a polymer matrix extending perpendicular to said first dimension, said elongated strip-like conductors extending between said planar members; and external connection means connected to said conductors at said opposed edges of said array, electrical connection between said external connection means and upper and lower surfaces of said individual ceramic members being provided solely by said strip-like conductors, and whereby each of the individual ceramic members of each of the emitters of each element may be excited simultaneously by electrical drive signals in order to collectively emit ultrasonic energy.

2. The transducer of claim 1, wherein alternating ones of said strip-like planar conductors are connected in parallel by connection means disposed at opposed edges of said array.

3. The transducer of claim 2, wherein said emitters each comprising a plurality of stacked individual ceramic members are formed by slitting a bonded stack of a like number of planar precursors, said planar precursors each comprising a plurality of elongated ceramic strips spaced from one another by polymer strips, said slitting being carried out perpendicular to the direction of elongation of said elongated ceramic strips, said strip-like conductors being cut from conductive members disposed between said stacked planar precursors during said slitting process.

4. The transducer of claim 3, wherein said layer of the material of said conductors is further extended to at least partially cover said opposed edges of each of said planar precursors, to enable connection of said means for connection thereto.

5. The transducer of claim 1, wherein the material of said ceramic members is selected from the group consisting of PZT ceramics, including PZT-5H, and PZT-5A; single crystal relaxors, including PZT-4, PZT-8, PZN-PT materials; and PMN-PT biased electrorestrictor materials.

6. The transducer of claim 1, wherein the material of said polymer matrix is one or more materials selected from the group consisting of epoxies, silicone rubbers, and urethanes.

7. The transducer of claim 1, wherein said transducer is steam-autoclavable, and wherein said ceramic members are formed of PZT-4, PZT-8, or PZT-5A ceramic materials, the material of said polymer matrix is epoxy and/or silicone rubber, and the material of said conductors is one or more of gold, silver, chromium, copper, or nickel.

8. An element for an ultrasonic transducer, wherein a plurality of said elements may be arranged in a row extending in a first dimension with a polymer layer between adjacent elements to form a tranducer, said element comprising an array of individual piezoelectric emitters spaced from one another in at least a second dimension by a polymer matrix, each emitter comprising a number of individual ceramic members stacked upon one another in a third dimension, juxtaposed individual ceramic members of each emitter being connected to one another by being bonded on opposite faces of strip-like electrical conductors extending continuously between opposed edges of said array in said second dimension, such that each of said members of said element can be excited simultaneously by a drive signal applied to said conductors by connections made at the edges of said array.

9. The transducer element of claim 8, wherein said individual emitters each comprising a stack of ceramic members in a polymer matrix connected to one another by said strip-like conductors are formed by assembling a stack of planar precursors, each comprising a number of parallel elongated ceramic strips spaced from one another by polymer strips and having a layer of the material of said conductors on at least one planar surface thereof, bonding said planar precursors to one another to form a bonded stack, slitting said bonded stack along a number of parallel slitting lines perpendicular to the direction of elongation of said ceramic strips, and filling the kerfs formed in said slitting step with a hardening polymer material.

10. The transducer element of claim 9, wherein said layer of the material of said conductors is further extended to at least partially cover an edge of each of said planar precursors, to enable connections to be made thereto.

11. The transducer element of claim 8, wherein the material of said ceramic members is selected from the group consisting of PZT ceramics, including PZT-4, PZT-8, PZT-5H, and PZT-5A; single crystal relaxors, including PZN-PT materials; and PMN-PT biased electrorestrictor materials.

12. The transducer element of claim 8, wherein said transducer element is steam-autoclavable, and wherein said ceramic members are formed from PZT-4, PZT-8, or PZT-5A ceramic material, the material of said polymer matrix is epoxy and/or silicone rubber, and the material of said conductors is one or more of gold, silver, chromium, copper, or nickel.

13. A steam-autoclavable ultrasonic transducer comprising a number of elements arranged in a row extending in a first dimension, and each element comprising at least two composite layers each including a plurality of individual ceramic members spaced from one another in at least a second dimension by a polymer matrix, strip-like front and rear conductors extending substantially continuously across said composite layers from one side to the other in the direction of said second dimension and electrically connected to front and rear surfaces of said individual members, adjacent ones of said elements and said conductors being separated from one another in said first dimension solely by planar polymer members extending transverse to said first dimension, wherein said ceramic members are formed from a piezoelectric ceramic material which does not lose its piezoelectric property when exposed to autoclaving temperatures, the material of said polymer matrix is epoxy and/or silicone rubber, and the material of said conductors is one or more of gold, silver, chromium, copper, or nickel.

14. The steam-autoclavable ultrasonic transducer of claim 13, wherein the relative volume fraction of the ceramic members with respect to the polymer of the matrix is chosen with respect to the material of other components of said transducer, such that the thermal coefficient of expansion of the composite layer comprising the ceramic members in the polymer matrix differs by no more than about 30 ppm/°C. from that of the material of said other components.

15. The steam-autoclavable transducer of claim 13, further comprising backing and matching layers having thermal coefficients of expansion (TCEs) generally comparable to that of said composite layer.

16. The steam-autoclavable transducer of claim 15, wherein the TCEs of said backing and matching layers and of said composite layer differ by no more than about 30 ppm/°C.

17. The steam autoclavable transducer of claim 13, wherein the material of said individual ceramic elements is PZT-4, PZT-8, or PZT-5A.

18. The steam autoclavable transducer of claim 13, further comprising an aluminum moisture barrier substantially encapsulating elements of said transducer.

\* \* \* \* \*